US005846846A

United States Patent [19]
Suh et al.

[11] Patent Number: 5,846,846
[45] Date of Patent: Dec. 8, 1998

[54] METHOD FOR MAKING A SUPERCONDUCTING FIELD-EFFECT DEVICE WITH GRAIN BOUNDARY CHANNEL

[75] Inventors: Jeong-Dae Suh; Gun-Yong Sung, both of Daejeon, Rep. of Korea

[73] Assignee: Electronics and Telecommunications Research Institute, Daejeon, Rep. of Korea

[21] Appl. No.: 560,962

[22] Filed: Nov. 20, 1995

Related U.S. Application Data

[62] Division of Ser. No. 350,456, Dec. 7, 1994, abandoned.

[30] Foreign Application Priority Data

Nov. 28, 1994 [KR] Rep. of Korea ............ 94 31493

[51] Int. Cl.$^6$ ................................................ H01L 21/00
[52] U.S. Cl. .................. 438/2; 438/198; 438/216; 427/62; 505/191; 505/193
[58] Field of Search .................... 427/62, 63; 437/40, 437/41; 438/2, 197, 198, 216; 505/191, 193

[56] References Cited

U.S. PATENT DOCUMENTS

| 5,057,485 | 10/1991 | Nishino et al. .......................... 257/36 |
| 5,116,072 | 5/1992 | Inada et al. ............................. 427/62 |
| 5,236,896 | 8/1993 | Nakamura et al. ..................... 427/62 |

(List continued on next page.)

FOREIGN PATENT DOCUMENTS

| 478 463 A1 | 1/1992 | European Pat. Off. . |
| 478 466 A1 | 1/1992 | European Pat. Off. . |
| 484 232 A2 | 6/1992 | European Pat. Off. . |
| 484 251 A2 | 6/1992 | European Pat. Off. . |
| 484 253 A2 | 6/1992 | European Pat. Off. . |

(List continued on next page.)

OTHER PUBLICATIONS

Applied Phys. Letter 62; Feb. 3, 1993; pp. 630–632; Large Electric Field Effects etc.; Strobel, Bednorz and Gerber.
IEEE Transactions on Applied Superconductivity, vol. 3, No. 1, Mar. 1993; Field Effect Transistor Based on A Bi–Crystal Grain Boundary Josephson Junction; Ivanov, Stepantsov, Tzalenchuk, Shekhter and Claeson.
Applied Phys. Letter 59; Dec. 23, 1991; Electric Field Effect in high Tc Superconducting ultrathin etc.; Li, Kwon, Bhattacharya, Findikoglu and Venkatesan; and Applied Phys. Letter 63; Aug. 2, 1993; Nakajima, Yokota, et al.

Primary Examiner—Tuan H. Nguyen
Attorney, Agent, or Firm—Jacobson, Price, Holman & Stern, PLLC

[57] ABSTRACT

Disclosed is a method for making a superconducting field-effect device with a grain boundary channel, the method comprising the steps of depositing a first superconducting thin film on a substrate; patterning the first superconducting thin film to form a patterned superconducting thin film having an opening; depositing a template layer thereon; selectively etching back the template layer to form a patterned template layer; growing a second superconducting thin film to form a grain boundary therebetween; depositing an insulating layer on the second superconducting thin film to protect the second superconducting thin film from degrading in property in the air; selectively etching back the insulating layer to form a patterned insulating layer; forming a gate insulating layer on the patterned insulating layer; and coating metal electrodes thereon, source/drain being formed respectively on the etched portions, and a gate electrode being formed on the deposited portion of the gate insulating layer directly above the grain boundary. In the superconducting FET manufactured thus, since a gate electrode is formed directly above a grain boundary, current flowing between source and drain can be controlled by a voltage applied through an gate insulating layer. Also, since the grain boundary serving as a channel can be formed in a cheaper oxide crystal substrate by variation in a growing temperature of thin film without using an expensive by-crystal substrate, a high-temperature superconducting FET can be economically fabricated.

15 Claims, 4 Drawing Sheets

U.S. PATENT DOCUMENTS

| | | |
|---|---|---|
| 5,273,136 | 12/1993 | Bednorz et al. . |
| 5,274,249 | 12/1993 | Xi et al. ................................. 427/62 |
| 5,278,136 | 1/1994 | Bednorz et al. ......................... 505/1 |
| 5,322,526 | 6/1994 | Nakamura et al. . |
| 5,324,714 | 6/1994 | Inam et al. ............................. 257/35 |
| 5,358,928 | 10/1994 | Ginley et al. ........................... 257/36 |
| 5,366,953 | 11/1994 | Char et al. .............................. 257/35 |
| 5,422,336 | 6/1995 | Tsuda et al. ............................ 427/63 |
| 5,525,582 | 6/1996 | Tanaka et al. .......................... 437/62 |
| 5,637,555 | 6/1997 | Nakamura et al. ..................... 427/62 |

FOREIGN PATENT DOCUMENTS

| | | |
|---|---|---|
| 523 275 A1 | 1/1993 | European Pat. Off. . |
| 533 519 A2 | 3/1993 | European Pat. Off. . |
| 545816 | 6/1993 | European Pat. Off. ................ 257/36 |
| 565 452 A1 | 10/1993 | European Pat. Off. . |
| 576 363 A1 | 12/1993 | European Pat. Off. . |
| 6053561 | 2/1994 | Japan ...................................... 257/35 |

METHOD FOR MAKING A SUPERCONDUCTING FIELD-EFFECT DEVICE WITH GRAIN BOUNDARY CHANNEL

This is a division of application Ser. No. 08/350,456 filed Dec. 7, 1994, now abandoned.

BACKGROUND OF THE INVENTION

1. Field of the Invention

The present invention relates to a superconducting field-effect device with a grain boundary channel and a method for making the same, and more particularly to a superconducting field-effect transistor in which a grain boundary formed in a high-temperature superconducting thin film is used as a channel thereof, and a method for making the same.

2. Description of the Prior Art

Generally, a superconducting field-effect transistor has widely used as an active device, which has a fast calculating speed, a fast data processing speed and a low-consumption power. in characteristics thereof, and can be mainly embodied in a signal processing apparatus, such as a video signal processing system, a high-performance work-station, a satellite signal processing system, a super computer and the like.

FIG. 1 shows a construction of a prior art superconducting field-effect transistor(hereinafter, referred to as "FET") having an extremely thin superconducting channel. As shown in FIG. 1, the prior art superconducting FET comprises a substrate 11 composed of $YBa_2Cu_3O_{7-x}$, an extremely thin superconducting channel 12 composed of an oxide superconductor thin film on the principal surface of the substrate 11, and an insulating layer 13 formed on the superconducting channel 12. The FET further comprises source/drain electrodes 15 and 16 which are formed on both ends of the superconducting channel layer 12 and formed of a metal, and a gate electrode 14 which is formed on the insulating layer 13 and formed of a metal. In this FET structure, the insulating layer 13 is formed of $SrTiO_3$ and the superconducting channel 12 is composed of a high-temperature superconducting thin film. This superconducting FET is composed of a three-layer structure in which metal-insulator-high temperature superconductor layers are sequentially formed on the substrate 11, and is disclosed in European Patent Publication No. 0 533 519 A2.

FIG. 2 shows a construction of a further prior art superconducting FET with an inverted three-layer structure. The superconducting FET of FIG. 2 comprises an $SrTiO_3$ substrate 21 doped with Nb, a platinum layer 22 formed on a main surface of the substrate 21, and a superconducting channel layer 24 formed above the platinum layer 22 with an insulating layer 23 interposed therebetween. The superconducting FET of FIG. 2 further comprises metal source/drain electrodes 25 and 26 which are formed on the superconducting channel layer 24 and electrically isolated from each other, and a gate electrode 27 which is formed on the back surface of the substrate 21. This superconducting FET of FIG. 2 has an inverted three-layer structure in comparison with the superconducting FET of FIG. 1, and is disclosed in U.S. Pat. No. 5,278,138.

In these superconducting FETs, however, since a high-temperature superconducting film is utilized as a gate, there arises a serious problem that electric field effect is lowered within several percents.

Also, there are the reasons that high field electric effect can not be obtained in the prior art superconducting FETs.

One of the reasons is that an ultra-thin film having 100Å or less in thickness is embodied as a high-temperature superconducting channel layer of the FET. In practical fabrication of the high-temperature superconducting layer, there arises several problems.

First, in case of making a $YBa_2CuO_{7-x}$ superconducting layer having extremely thin film, since the superconducting layer reacts chemically on moisture in air and is decomposed at a very fast speed to be changed to other material, it loses a superconducting characteristics thereof.

Secondly, in fabrication of the superconducting transistor, since several steps of etching processes have to be carried out, an extremely thin superconducting layer is seriously lowered in chemical stability.

Finally, if thickness of an extremely thin superconducting layer is further thin, reproduction of such a superconducting layer is seriously lowered because of a limit of an optimum range of a film formation condition.

In addition, Another prior art superconducting FET is disclosed in which weak links are artificially produced in a high-temperature superconducting thin film to be used as a gate thereof. In such a superconducting FET, a grain boundary serving as weak links is formed in the high-temperature superconducting thin film to be used as a channel therein. The prior art superconducting FET using a grain boundary as a channel is fabricated by the steps of polishing a main surface of a substrate to form a plurality of grooves, and growing a high-temperature superconducting thin film on the main surface of the substrate to form grain boundary group in the vicinity of the grooves. This fabrication method is disclosed in letter of "J. Mannhart, etal., Applied Physics Letters 62(6), pp630–632, 1993".

Another fabrication method of such a superconducting FET comprises the step of uniting two crystals having different crystal orientation to form a bi-crystal substrate, and growing a high-temperature superconducting thin film on the by-crystal substrate to form a grain boundary in the junction portion of the bi-crystal substrate. This fabrication method is disclosed in letter of "K. Nakajima, etal., Applied Physics Letters 63(5), pp684–688, 1993", or "Z. G. Invanov, etal., IEEE Transactions on Applied Superconductivity, Vol. 3, No. 1, pp2925–2928, 1993".

However, since the above-described methods all utilize that a substrate is mechanically modulated on a surface thereof, where a high-temperature superconducting thin film is deposited, so as to form a plurality of grooves and then a grain boundary is produced in the superconducting thin film, there arise several problems.

One of the problems is that several complicated steps of processing a substrate, such as a substrate polishing, a substrate cleaning, a substrate annealing and the like, are required to make grooves on the substrate. Another problem is that it is difficult to control the number and depth of grooves. Also, since a bi-crystal substrate is very expensive in comparison with a crystal substrate, a high-temperature superconducting FET can not be economically fabricated in case of using a bi-crystal substrate.

SUMMARY OF THE INVENTION

It is an object of the present invention to provide a superconducting FET in which a grain boundary formed between superconducting layers having a different crystal orientation is used as a channel.

It is another object of the present invention to provide a method for making a superconducting FET in which a grain boundary is produced in accordance with crystal orientations during growing a high-temperature superconducting thin film.

It is a further object of the present invention to provide a method for making a superconducting FET in which a grain boundary is produced in accordance with variation in growing temperature of a high-temperature superconducting thin film.

According to the aspect of the present invention, the superconducting field-effect device with a grain boundary channel comprising an oxide crystal substrate; first high-temperature superconducting thin films electrically isolated with each other, each of the first high-temperature superconducting thin films serving as source/drain; a template layer formed on one of the first high-temperature superconducting thin films and a portion of an exposed surface of the substrate; a second high-temperature superconducting thin film having a first portion which is vertically oriented in c-axis on which the template layer does not exist, a second portion which is horizontally oriented in a c-axis on which the template layer exists, and a grain boundary formed between the first and second portions; a gate insulating layer formed on the second high-temperature superconducting thin film; a gate electrode formed on the gate insulating layer; and source and drain electrodes formed on exposed surfaces of the second high-temperature superconducting thin film above both of the first high-temperature superconducting thin films.

According to another aspect of the present invention, the method for making a superconducting field-effect device with a grain boundary channel, the method comprising the steps of preparing an oxide crystal substrate; depositing a first high-temperature superconducting thin film on a main surface of the oxide crystal substrate; patterning the first superconducting thin film so as to form a patterned superconducting thin film having an opening; depositing a template layer thereon at a first predetermined temperature; selectively etching back the template layer to form a patterned template layer having an exposed portion where the template layer is removed and a grown portion where the template layer is deposited; growing a second high-temperature superconducting thin film at a second predetermined temperature to form a grain boundary between the exposed portion and the patterned template layer in accordance with orientation thereof; depositing an insulating layer on the second high-temperature superconducting thin film so as to protect the second high-temperature superconducting thin film from degrading in property in the air; selectively etching back the insulating layer to form a patterned insulating layer having a deposited portion formed over the opening and etched portions formed above the patterned superconducting thin film; forming a gate insulating layer on the patterned insulating layer; and coating metal electrodes thereon, source/drain electrodes being formed respectively on the etched portions, and a gate electrode being formed on the deposited portion of the gate insulating layer directly above the grain boundary.

In this method, the oxide crystal substrate is composed of one of materials of an oxide class of superconductors.

In this method, the oxide class of superconductors comprises a (100)-oriented insulating substrate of $SrTiO_3$, or a (100)-orientation insulating substrate of $LaSrGaO_4$.

In this method, the step of depositing the first high-temperature superconducting thin film is carried out at a substrate temperature of from 750° C. to 800° C., and under oxygen pressure of about 100 mTorr so as to form the template layer having a thickness of 100 nm. The template layer is composed of $PrBa_2Cu_3O_{7-x}$ ($0 \leq x \leq 7$).

In this method, the step of depositing the template layer is carried out at a substrate temperature of from 600° C. to 650° C., and under oxygen pressure of about 100 mTorr so as to form the template layer having a thickness of 200 nm.

In this method, the step of growing the second superconducting thin film is carried out at a substrate temperature of from 750° C. to 800° C., and under oxygen pressure of about 100 mTorr so as to form the second superconducting thin film having a thickness of 100 nm.

In this method, the second superconducting thin film has a first portion in which a high-temperature superconducting material is vertically oriented in c-axis on the exposed portion of the template layer, a second portion in which the high-temperature superconducting material is horizontally oriented in a c-axis on the grown portion of the template layer, and a grain boundary formed between the first and second portions.

In this method, the process of growing the second superconducting thin film comprises the steps of depositing a high-temperature superconducting material having a c-axis vertical orientation on the exposed portion of the template layer, and depositing a high-temperature superconducting material having a c-axis horizontal orientation on the grown portion of the template layer, thereby enabling the grain boundary to be formed between the materials having vertical-horizontal orientation. The second superconducting thin film is composed of $YBa_2Cu_3O_{7-x}$ ($0 \leq x \leq 7$).

In this method, the step of depositing the insulating layer is carried out at a substrate temperature of from 650° C. to 700° C., and under oxygen pressure of about 100 mTorr so as to form the insulating layer having a thickness of 10 nm. The insulating layer is composed of $SrTiO_3$.

In this method, the step of depositing the gate insulating layer is carried out at a substrate temperature of from 650° C. to 700° C., and under oxygen pressure of about 100 mTorr so as to form the gate insulating layer having a thickness of 100 nm. The gate insulating layer is composed of $SrTiO_3$.

In this method, each of the metal electrodes has a thickness of 100 nm and is composed of Ag or Au.

In the superconducting FET manufactured thus, since a gate electrode is formed directly above a grain boundary, current flowing between source and drain can be controlled by a voltage applied through an gate insulating layer.

Also, since the grain boundary serving as a channel can be formed in a cheaper oxide crystal substrate by variation in a growing temperature of thin film without using an expensive bi-crystal substrate, a high-temperature superconducting FET can be economically fabricated.

BRIEF DESCRIPTION OF THE DRAWINGS

This invention may be better understood and its object and advantage will become apparent to those skilled in the art by reference to the accompanying drawings as follows.

DESCRIPTION OF THE PREFERRED EMBODIMENT(S)

Figure 1:
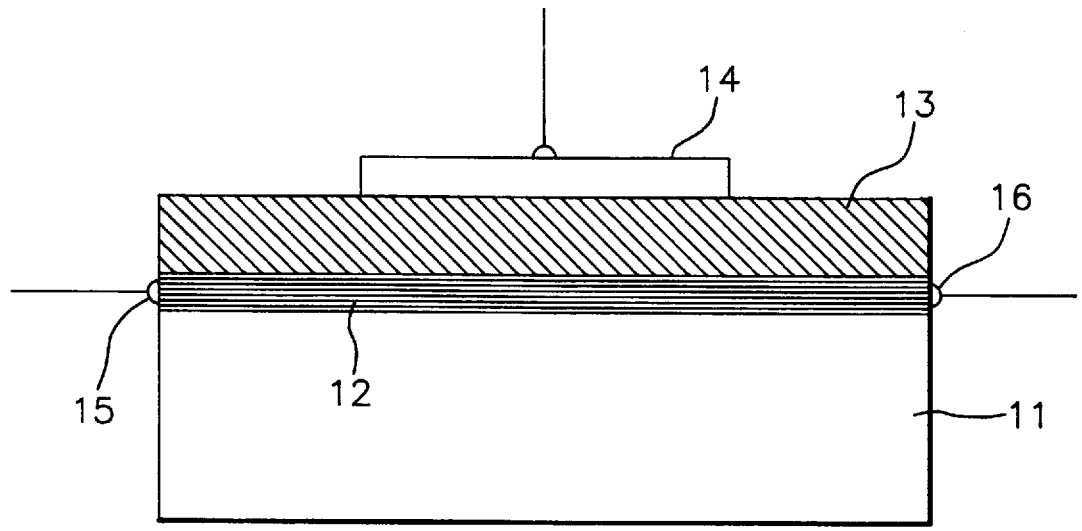
FIG. 1 is a cross-sectional view showing the construction of a prior art superconducting field-effect device which is composed of a three-layer structure of metal-insulator-superconductor.
Figure 2:
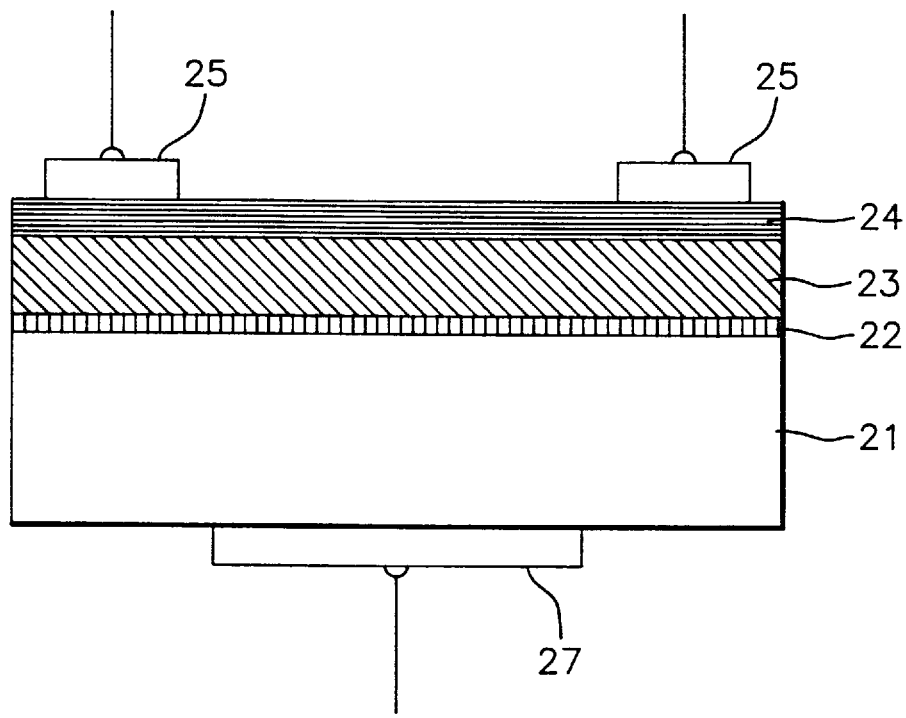
FIG. 2 is a cross-sectional view showing the construction of another prior art superconducting field-effect device which is composed of an inverted three-layer structure.
Figure 3A:
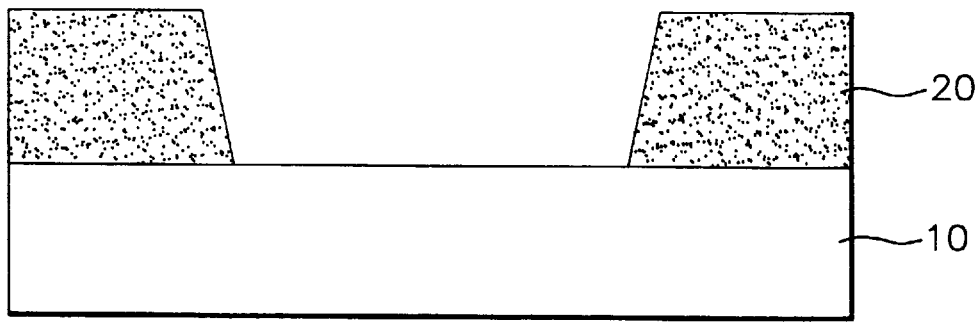
FIGS. 3A to 3H are cross-sectional views showing the steps of making a high-temperature superconducting field-effect device in accordance with one embodiment of the present invention.

Referring to FIG. 3A, it is shown that a patterned superconducting thin film 20 is formed on an oxide crystal substrate 10 by using a pulse laser deposition. The forming process of the patterned superconducting thin film 20 is carried out at a substrate temperature of from 750° C. to 800° C., and under oxygen pressure of about 100 mTorr so as to form the template layer having a thickness of 100 nm.

In detail, on the substrate 10 a high-temperature superconducting layer of a $YBa_2Cu_3O_{7-x}$ ($0 \leq x \leq 7$) material is deposited, and then a patterning process is performed. Thus, the patterned superconducting thin film 20 is formed on the substrate 10, as shown in FIG. 3A.

In deposition of the superconducting layer, the $YBa_2Cu_3O_{7-x}$ ($0 \leq x \leq 7$) material is vertically oriented on the substrate 10. In patterning of the superconducting layer, a well-known dry-etching method such as an argon ion milling is carried out to selectively remove the superconducting layer, and thus the patterned superconducting thin film 20 having an opening is formed on the substrate. The remaining superconducting layer 20 serves as source/drain regions of a FET.

The substrate is composed of one of materials of an oxide class of superconductors, such as a (100)-oriented insulating substrate of $SrTiO_3$, or a (100)-orientation insulating substrate of $LaSrGaO_4$.

Figure 3B:
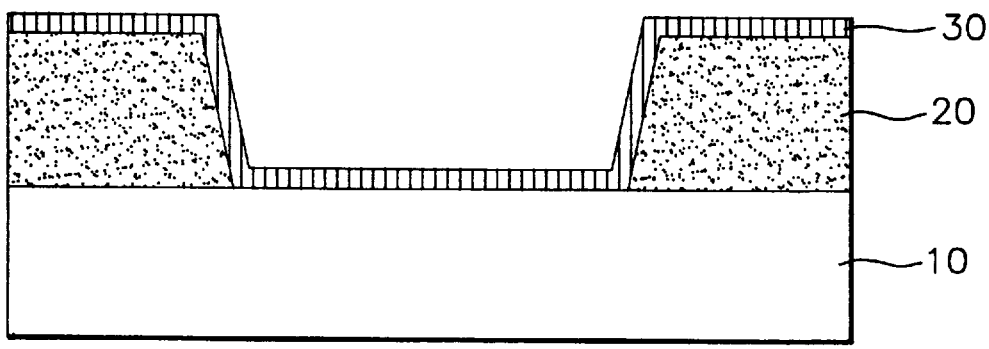

FIG. 3B shows that a template layer 30 is formed on the structure of FIG. 3A. As shown in FIG. 3B, the template layer 30 composed of $PrBa_2Cu_3O_{7-x}$ ($0 \leq x \leq 7$) is deposited on the patterned superconducting thin film 20. The forming process of the template layer 30 is carried out at a substrate temperature of from 600° C. to 650° C., and under oxygen pressure of about 100 mTorr so as to form the template layer having a thickness of 200 nm.

Subsequently, a patterning process is performed so as to form a patterned template layer 30a. Then, by a well-known dry-etching method is carried out to selectively remove only a portion of the template layer 30, as shown in FIG. 3C.

In this embodiment, a removed portion of the template layer 30 is called a first portion, and a remaining portion of the template layer 30 is called a second portion.

Figure 3C:
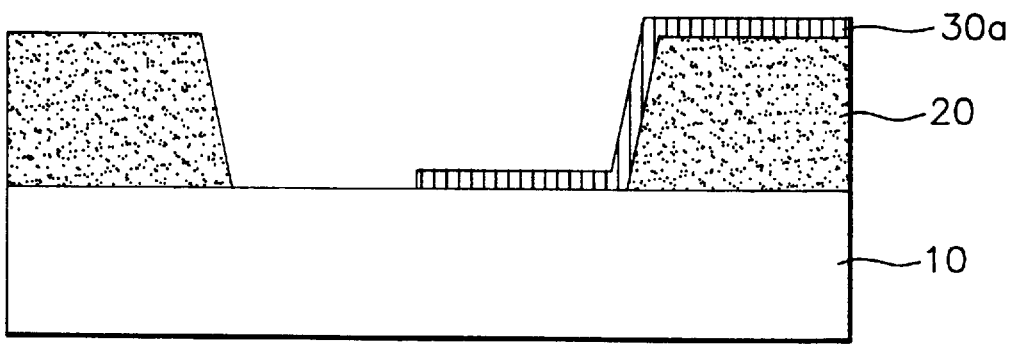
Figure 3D:
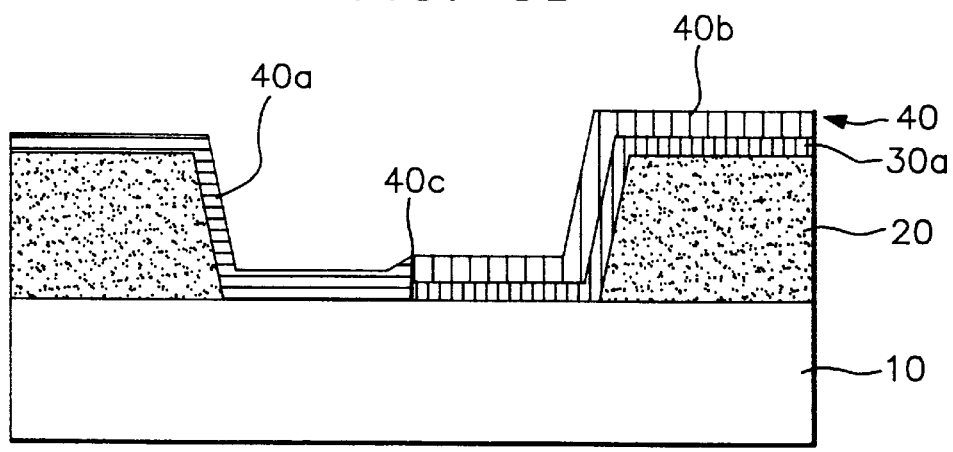

FIG. 3D shows that a high-temperature superconducting thin film 40 having a grain boundary 40c is formed on the structure of FIG. 3C. As shown in FIG. 3D, the high-temperature superconducting thin film 40 is grown on the patterned template layer 30a. This growing process of the superconducting thin film 40 is carried out at a substrate temperature of from 750° C. to 800° C., and under oxygen pressure of about 100 mTorr so as to form the second superconducting thin film having a thickness of 100 nm. Then, a grain boundary 40c is formed in the superconducting thin film 40 owing to a difference of orientation.

In detail, during growing the superconducting thin film 40, a high-temperature superconducting material is vertically oriented in c-axis on the first portion of the patterned template layer 30a, and at the same time a high-temperature superconducting material is horizontally oriented in c-axis on the second portion of the patterned template layer 30a. This is because a high-temperature superconducting thin film is grown directly on an exposed surface of the substrate 10 and on a portion of the patterned superconducting thin film 20 where a template film does not exist. For example, similarly to the above-described growing condition, a high-temperature superconducting thin film 40a is grown in a c-axis vertical orientation on the first portion where a template film of $PrBa_2Cu_3O_{7-x}$ exists, but a high-temperature superconducting thin film 40b is grown in a c-axis horizontal orientation on the second portion where the template film of $PrBa_2Cu_3O_{7-x}$ does not exist, as shown in FIG. 3D.

In addition, during growing the high-temperature superconducting thin film 40, a grain boundary 40c is formed between the c-axis vertically oriented superconducting thin film 40a and the c-axis horizontally oriented superconducting thin film 40b owing to a difference of orientation therebetween.

In this embodiment, the high-temperature superconducting thin film 40 is composed of $YBa_2Cu_3O_{7-x}$ ($0 \leq x \leq 7$).

Figure 3E:
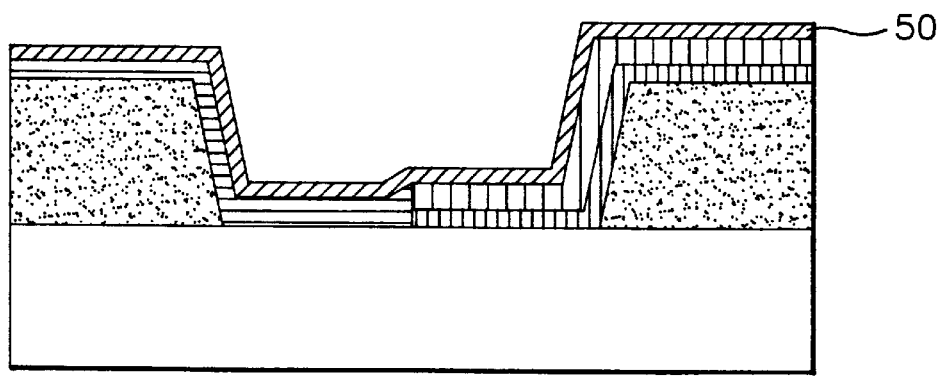

FIG. 3E shows that an insulating layer 50 is formed on the high-temperature superconducting thin film 40. This forming process of the insulating layer 50 is carried out at a substrate temperature of from 650° C. to 700° C., and under oxygen pressure of about 100 mTorr so as to form the insulating layer having a thickness of 10 nm. The insulating layer is provided to prevent the high-temperature superconducting thin film 40 from degrading in property thereof due to exposure of the superconducting thin film 40 in the air, and also is composed of $SrTiO_3$.

Figure 3F:
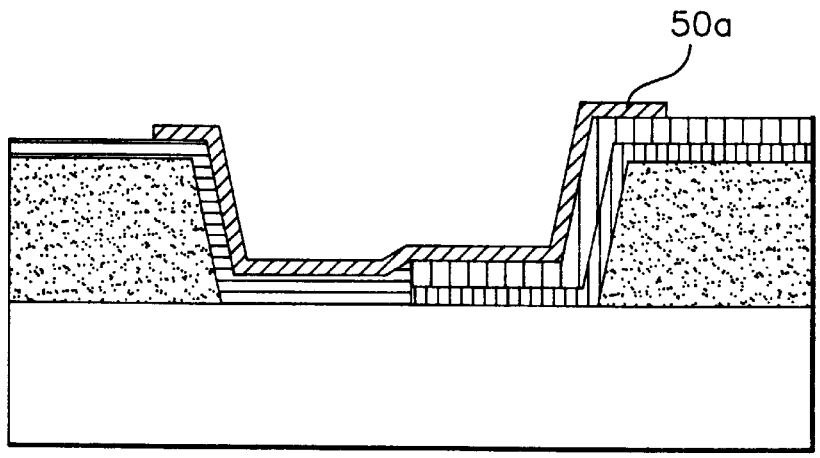

FIG. 3F shows that the insulating layer 50 is selectively removed. To coat source/drain electrodes on exposed surface of the patterned superconducting thin film 40, a patterned insulating layer 50a is formed, as shown in FIG. 3F.

Figure 3G:
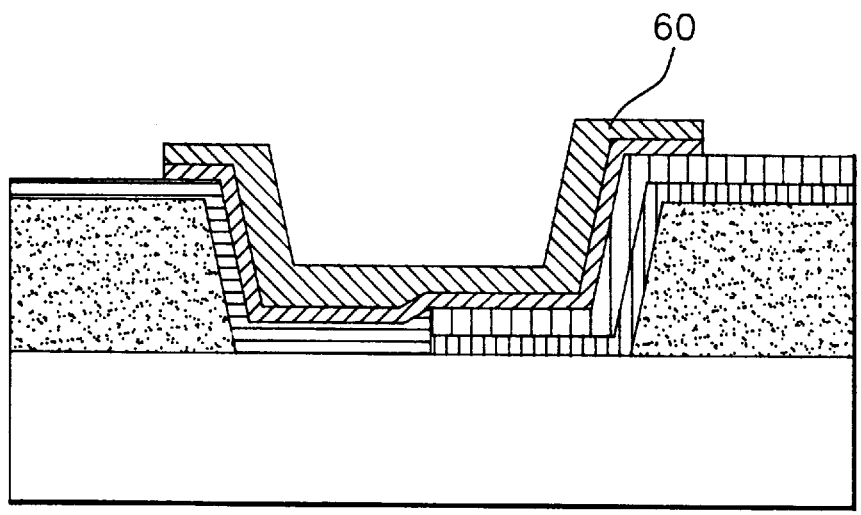

FIG. 3G shows that a gate insulating layer 60 of $SrTiO_3$ is formed on the patterned insulating layer 50a. The forming process of the gate insulating layer 60 is carried out at a substrate temperature of from 650° C. to 700° C., and under oxygen pressure of about 100 mTorr so as to form the gate insulating layer having a thickness of 100 nm. The gate insulating layer 60 of 100 nm in thickness is enough to prevent a tunnelling current from flowing therethrough.

Finally, source/drain electrodes 70a, 70b are formed on exposed surfaces of the high-temperature superconducting thin film 40, and at the same time a gate electrode 70c is formed on a portion of the gate insulating layer 60. The electrodes has a thickness of 100 nm and is composed of Ag or Au.

Figure 3H:
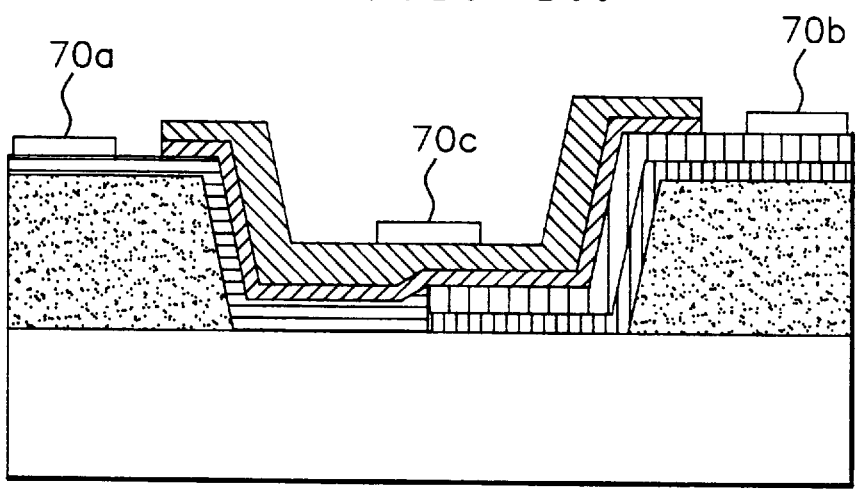

As described above, in the superconducting field-effect transistor which is manufactured in accordance with the making method of the present invention, since a gate electrode is formed directly above a grain boundary, as shown in FIG. 3H, current flowing between source and drain electrodes can be controlled by a voltage applied through an gate insulating layer.

Furthermore, since the grain boundary serving as a channel can be formed in a cheaper oxide crystal substrate by variation in a growing temperature of thin film without using an expensive by-crystal substrate, a high-temperature superconducting field-effect device can be economically fabricated.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for making a superconducting field-effect device with a grain boundary channel, the method comprising the steps of:

preparing an oxide crystal substrate;

depositing a first superconducting thin film on a main surface of the oxide crystal substrate;

patterning the first superconducting thin film so as to form a patterned super conducting thin film having an opening;

depositing a template layer thereon;

selectively etching back the template layer to form an exposed portion of the oxide crystal substrate where the template layer is removed and a grown portion where the template layer is deposited;

growing a second superconducting thin film to form a grain boundary between the exposed portion and the patterned template layer in accordance with orientation thereof;

depositing an insulating layer on the second superconducting thin film so as to protect the second superconducting thin film from degrading in property in the air;

selectively etching back the insulating layer to form a patterned insulating layer having a deposited portion formed over the opening;

forming a gate insulating layer on the patterned insulating layer; and coating metal electrodes thereon, source/drain electrodes being formed respectively on the second superconducting thin film where the insulating layer is etched, and a gate electrode being formed on the deposited portion of the gate insulating layer directly above the grain boundary.

2. The method as defined in claim 1, wherein the oxide crystal substrate is composed of one of materials of an oxide class of superconductors.

3. The method as defined in claim 2, wherein the oxide class of superconductors comprises a (100)-oriented insulating substrate of $SrTiO_3$, or a (100)-orientation insulating substrate of $LaSrGaO_4$.

4. The method as defined in claim 1, wherein the step of depositing the first superconducting thin film is carried out at a substrate temperature of from 750° C. to 800° C., and under oxygen pressure of about 100 mTorr so as to form the template layer having a thickness of 100 nm.

5. The method as defined in claim 1, wherein the template layer is composed of $PrBa_2Cu_3O_{7-x}$ ($0 \leq x \leq 7$).

6. The method as defined in claim 1, wherein the step of depositing the template layer is carried out at a substrate temperature of from 600° C. to 650° C., and under oxygen pressure of about 100 mTorr so as to form the template layer having a thickness of 200 nm.

7. The method as defined in claim 1, wherein the step of growing the second superconducting thin film is carried out at a substrate temperature of from 750° C. to 800° C., and under oxygen pressure of about 100 mTorr so as to form the second superconducting thin film having a thickness of 100 nm.

8. The method as defined in claim 1, wherein the second superconducting thin film has a first portion in which a superconducting material is vertically oriented in c-axis on the exposed portion of the template layer, a second portion in which the high-temperature superconducting material is horizontally oriented in a c-axis on the grown portion of the template layer, and a grain boundary formed between the first and second portions.

9. The method as defined in claim 1, wherein the step of growing the second superconducting thin film comprises depositing a superconducting material having a c-axis vertical orientation on the exposed portion of the template layer, and depositing a superconducting material having a c-axis horizontal orientation on the grown portion of the template layer, thereby enabling the grain boundary to be formed between the materials having vertical-horizontal orientation.

10. The method as defined in claim 1, wherein the second superconducting thin film is composed of $YBa_2Cu_3O_{7-x}$ ($0 \leq x \leq 7$).

11. The method as defined in claim 1, wherein the step of depositing the insulating layer is carried out at a substrate temperature of from 650° C. to 700° C., and under oxygen pressure of about 100 mTorr so as to form the insulating layer having a thickness of 10 nm.

12. The method as defined in claim 11, wherein the insulating layer is composed of $SrTiO_3$.

13. The method as defined in claim 11, wherein the gate insulating layer is composed of $SrTiO_3$.

14. The method as defined in claim 1, wherein the step of depositing the gate insulating layer is carried out at a substrate temperature of from 650° C. to 700° C., and under oxygen pressure of about 100 mTorr so as to form the gate insulating layer having a thickness of 100 nm.

15. The method as defined in claim 1, wherein each of the metal electrodes has a thickness of 100 nm and is composed of Ag or Au.

* * * * *